United States Patent [19]

Knudsen

[11] Patent Number: 5,483,199

[45] Date of Patent: Jan. 9, 1996

[54] METHOD AND APPARATUS FOR COMPENSATING THERMAL TIME CONSTANTS IN AN ELECTRONIC AMPLIFIER

[75] Inventor: Knud L. Knudsen, Menlo Park, Calif.

[73] Assignee: Hewlett-Packard Company, Palo Alto, Calif.

[21] Appl. No.: 327,087

[22] Filed: Oct. 21, 1994

[51] Int. Cl.⁶ .................................................. H03F 1/30
[52] U.S. Cl. .................................................. 330/289
[58] Field of Search .................................. 330/256, 266, 330/272, 289

[56] References Cited

U.S. PATENT DOCUMENTS

| | | | |
|---|---|---|---|
| 3,418,592 | 12/1968 | Solomon et al. | 330/289 |
| 3,753,139 | 8/1973 | Spencer | 330/289 X |
| 4,442,410 | 4/1984 | Daniel | 330/289 |
| 5,200,654 | 4/1993 | Archer | 330/256 X |
| 5,331,291 | 7/1994 | D'Agostino et al. | 330/289 |

FOREIGN PATENT DOCUMENTS

| | | | |
|---|---|---|---|
| 77707 | 5/1984 | Japan | 330/289 |
| 141806 | 8/1984 | Japan | 330/289 |
| 22812 | 2/1985 | Japan | 330/289 |
| 135210 | 6/1986 | Japan | 330/289 |
| 2263034 | 7/1993 | United Kingdom | 330/289 |

*Primary Examiner*—James B. Mullins

[57] ABSTRACT

A method and apparatus for maintaining stability while substantially compensating an output signal of a high gain, wide band amplifier having an undesirable signal dependent offset voltage, generated by signal dependent self heating of circuit components. A thermal offset voltage generator producing a signal dependent thermally generated offset voltage similar to that of the wide band amplifier is provided. The input of the thermal offset voltage generator is coupled an output of the wide band amplifier. The output of the thermal offset voltage generator is amplified and low pass filtered to provide a filtered compensating signal. The filtered compensating signal is injected into the wide band amplifier so as to substantially compensate an output signal of the wide band amplifier for the signal dependent thermally generated offset voltage of the wide band amplifier.

8 Claims, 3 Drawing Sheets

METHOD AND APPARATUS FOR COMPENSATING THERMAL TIME CONSTANTS IN AN ELECTRONIC AMPLIFIER

FIELD OF THE INVENTION

The present invention generally relates to electronic amplifiers, and more particularly relates to compensation of signal dependent thermally generated offset voltages in wide band electronic amplifiers.

BACKGROUND OF THE INVENTION

Signal dependent self heating of circuit components in electronic amplifiers causes undesirable signal dependent thermally generated offset voltages having long time constants, which are associated with heat dissipation in the amplifier components. The time constants, or equivalently the frequency dependence, of the heat dissipation in the components is determined by the thermal properties of the components, which in turn are determined by geometry and material of the components.

In general a magnitude of the offset voltages is the strongest at DC (Direct Current) and will gradually taper off for frequencies above some low corner frequency. For example, in integrated bipolar junction transistor technology the bipolar junction transistors are the main sources of signal dependent thermally generated offset voltages. Frequency dependence of these offset voltages is typically flat from dc to a few hundred Hz and becoming insignificant above approximately 100 MHz.

The importance of such signal dependent thermally generated offset voltages is particularly shown in a step response of the wide band amplifier. The step response initially appears to settle in a few nanoseconds, but then slowly creeps towards a final value over several milliseconds. This type of problem is particularly troublesome in DC coupled, high gain, wide band amplifiers used in the vertical display channel in oscilloscopes, where such step settling is easily observed in display traces, over many decades of sweep speed of the oscilloscopes. Of course this type of problem is also troublesome in amplifiers used in other types of electronic instrumentation.

It is in general difficult to ensure stability—i.e. freedom from oscillation—in a wide band high gain amplifier. This is particularly so if a large amount of negative feedback is used to flatten the response of such an amplifier.

What is needed is a method and apparatus that substantially compensates for the signal dependent thermally generated offset voltages without introducing stability problems in the wide band high gain amplifier.

SUMMARY OF THE INVENTION

The present invention provides a method and apparatus for maintaining stability while substantially compensating an output signal of a high gain, wide band amplifier having an undesirable signal dependent offset voltage generated by signal dependent self heating of amplifier components.

In accordance with the invention, a thermal offset voltage generator that produces a signal dependent thermally generated offset voltage similar to that of the wide band amplifier is provided. An input of the thermal offset generator is coupled with an output of the wide band amplifier so as to generate a compensating signal. The compensating signal includes the signal dependent thermally generated offset voltage of the generator. The compensating signal is preferably amplified and low pass filtered to provide a filtered compensating signal. The filtered compensating signal is injected into the wide band amplifier so as to substantially compensate the output signal of the wide band amplifier for the thermally generated offset voltage the wide band amplifier.

A corner frequency of the low pass filtering is selected to substantially correspond with the frequency at which the signal dependent thermally generated offset voltages have become insignificant. Accordingly, the filtered compensating signal includes low frequency components that are needed for compensation, but does not include high frequency components that would otherwise add noise and tend to undermine the stability of the high gain, wide band amplifier.

In accordance with the teachings of the invention, needed gain flattening of the wide band amplifier is generally less than ten percent. Therefore, injecting the necessary amount of filtered compensating signal back into the wide band amplifier causes a loop gain of less than ten percent at very low frequencies nearing Direct Current (DC), diminishing to zero at a somewhat higher frequency that is still below the band edge of the wide band amplifier. Hence there is no gain crossover and no stability problem as there would otherwise be in using conventional negative feedback with large loop gain.

Other aspects and advantages of the present invention will become apparent from the following detailed description, taken in conjunction with the accompanying drawings, illustrated by way of example the principles of the invention.

DETAILED DESCRIPTION OF PREFERRED EMBODIMENT

Figure 1:
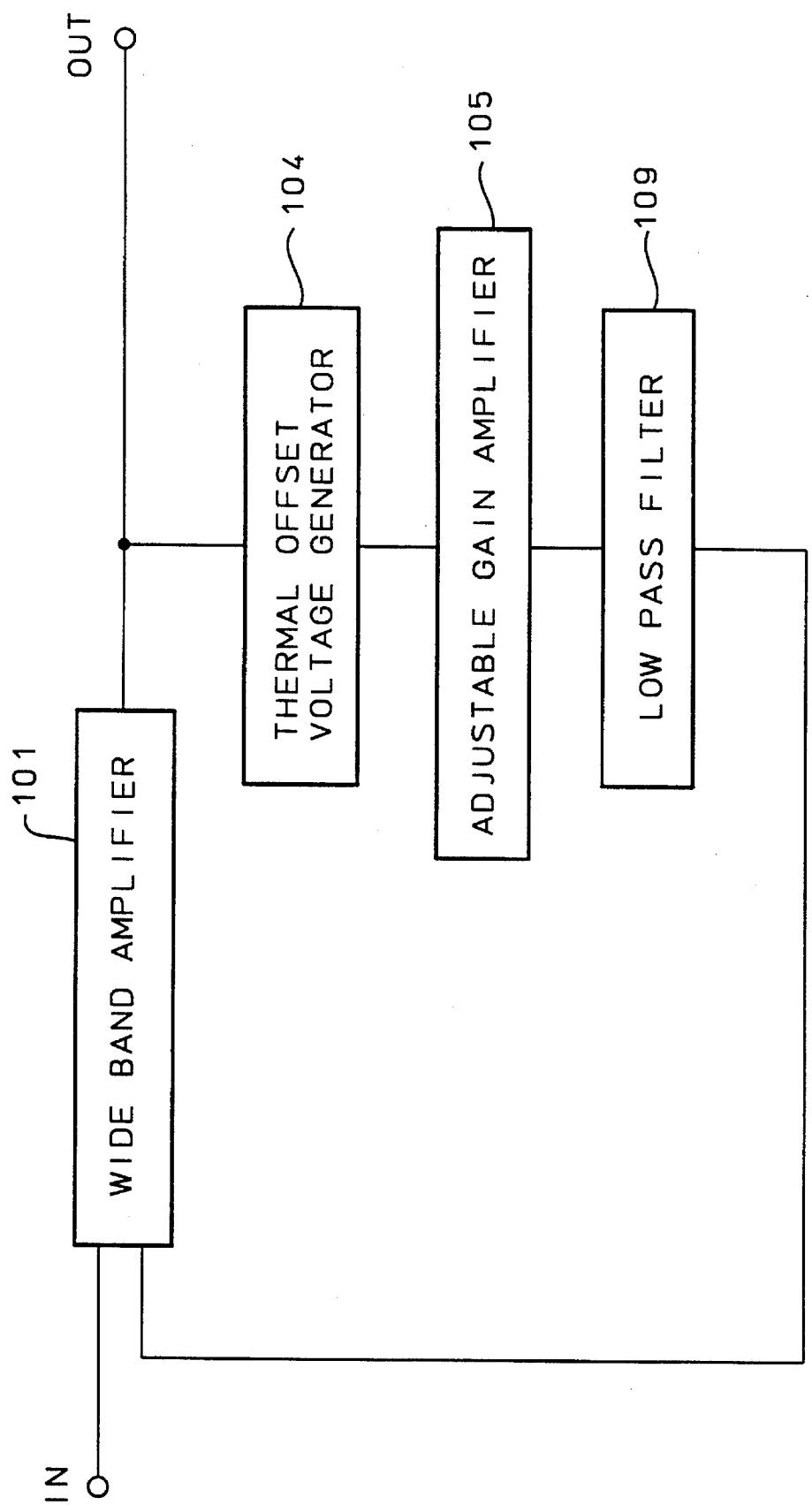
FIG. 1 shows a block diagram of the invention.

FIG. 1 shows a block diagram of the present invention. The present invention preserves stability while substantially compensating an output signal of a high gain, wide band amplifier 101 having an undesirable signal dependent thermally generated offset voltage. In the preferred embodiment the amplifier is DC coupled, and is wide band, for example substantially including a band from DC to near five hundred megahertz, or more. In accordance with the invention, a thermal offset voltage generator 104 producing a signal dependent thermally generated offset voltage similar to that of the wide band amplifier is provided.

As shown in FIG. 1, an input of the thermal offset generator 104 is coupled with an output of the wide band amplifier so as to so as to generate a compensating signal. The compensating signal includes the signal dependent thermally generated offset voltage of the generator. Preferably, an adjustable gain amplifier 105 is coupled with the thermal offset voltage generator. Preferably, the adjustable gain amplifier is adjusted for best possible flat frequency response of the wide band amplifier during a calibration procedure.

Preferably, a low pass filter 109 is coupled to an output of the adjustable gain amplifier 105. The low pass filter 109 provides a filtered compensating signal. The corner frequency of the low pass filtering is selected to substantially correspond with the frequency at which the signal dependent thermally generated offset voltages have become insignificant. Accordingly, the filtered compensating signal includes low frequency components that are needed for compensation, but does not include high frequency components that would otherwise add noise and tend to undermine the stability of the high gain, wide band amplifier.

The filtered compensating signal is injected into the wide band amplifier at a suitable node so as to substantially compensate the output signal of the wide band amplifier for the offset voltage of the wide band amplifier. Preferably, the filtered compensating signal is injected by circuit pathways coupled with a current summing node of a cascode stage of the wide band amplifier. However it should be understood that the invention is not strictly limited to injection at the current summing node of the cascode stage, since beneficial results are achieved by injecting the compensating signal at a suitable node located at the input of the amplifier, at the output of the amplifier, or at various suitable nodes therebetween. Accordingly, the wide band amplifier need not include a cascode stage.

Figure 2:
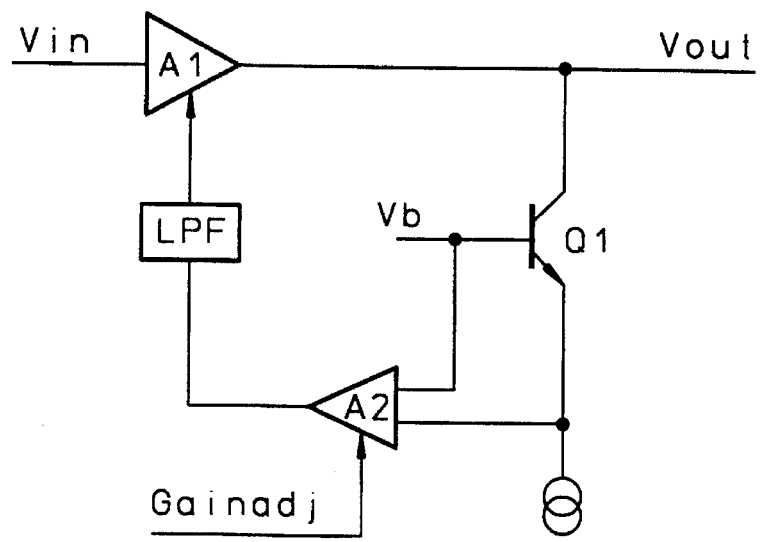
FIG. 2 is a schematic diagram showing a preferred embodiment of the invention of FIG. 1.

FIG. 2 is a schematic diagram showing a preferred embodiment of the invention of FIG. 1, as applicable when the circuit in FIG. 1 is implemented in a preferred bipolar junction transistor technology. A transistor, Q1, is coupled with an output of the preferred DC coupled, high gain, wide band amplifier, A1, as shown in FIG. 2. The transistor is constructed to have essentially the same geometry as devices in the wide band amplifier, A1, whose self heating causes the long settling time constants.

The transistor, Q1, is operated at a constant emitter current and its base is kept at a fixed voltage, Vb. The collector of the transistor is driven by the output of the wide band amplifier, A1, so therefore the power dissipated in the transistor varies linearly with a level of the output signal of the wide band amplifier. Accordingly, the transistor, Q1, has a signal dependent thermally generated offset voltage similar to that of the wide band amplifier.

The base-emitter voltage at constant current decreases as the device temperature increases. As a result the base-emitter voltage contains a component that is proportional to the signal, but low pass filtered by the appropriate thermal time constants. This thermal component of the base-emitter voltage is included in a compensating signal, which is amplified in an adjustable gain amplifier, A2, and injected via a low pass filter, LPF, into a suitable node of the wide band amplifier, A1.

The base-emitter voltage of the transistor, Q1, also contains a component of the wide band amplifier output caused by base width modulation. This component however, is small, independent of frequency, and therefore can be substantially ignored.

At very high frequencies, a signal at the collector of the transistor, Q1, is transmitted to the emitter terminal due to a base resistance and an intrinsic collector-base capacitance of the transistor. However, this signal transmission happens only at frequencies where the input dependent thermal gain changes of the wide band amplifier are insignificant. Accordingly, although this signal is transmitted to the emitter terminal of the transistor, it is subsequently removed by the low pass filter, LPF.

Figure 3:
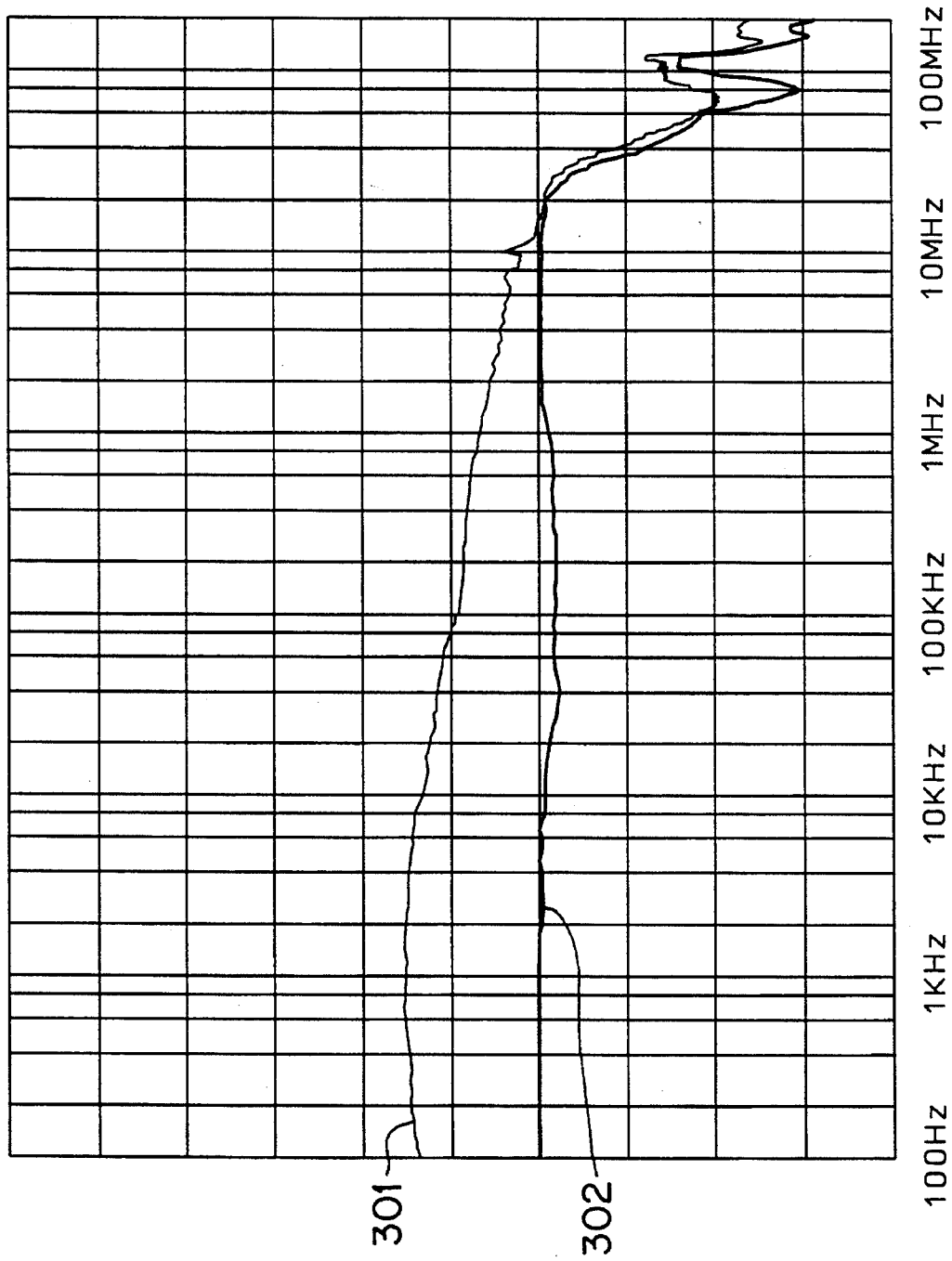
FIG. 3 is a diagram comparing a frequency response measurement of the embodiment of FIG. 2 to that of a wide band amplifier alone.

FIG. 3 is a diagram comparing a frequency response measurement of the embodiment of FIG. 2 to that of the DC coupled wide band amplifier alone, over a frequency range extending from one hundred hertz (100 Hz) to one hundred megahertz (100 MHz). A first trace 301 shows frequency response of the wide band amplifier alone. The enhanced low frequency components shown in the first trace 301 are representative of undesirable signal dependent thermally generated offset voltage in the output signal of the wide band amplifier. A second trace 302 shows frequency response of the embodiment of FIG. 2. Comparison of the first trace 301 and the second trace 302 reveals that the compensation provided by the invention advantageously reduces the undesirable signal dependent thermally generated offset voltage of the wide band amplifier.

Figure 4:
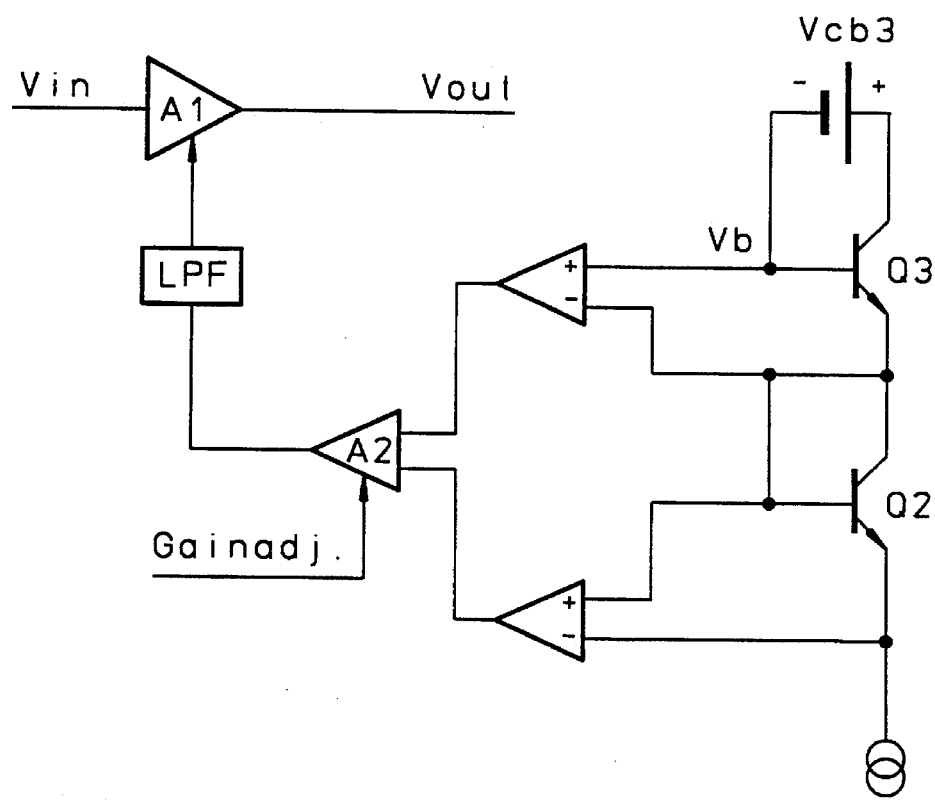
FIG. 4 is a schematic diagram showing another preferred embodiment of the invention of FIG. 1.

FIG. 4 is a schematic diagram showing another preferred embodiment of the invention of FIG. 1. As shown in FIG. 3, two transistors, Q2, Q3, are coupled together. The two transistors have essentially the same geometry as devices in the wide band amplifier, A1, whose self heating causes the long settling time constants.

The collector-base voltage of the transistor Q2 is zero, while the collector-base voltage of the transistor Q3 is a fixed voltage, Vcb3. The emitter currents in the two transistors are identical, and they are a substantially linear function of an output voltage of the wide band amplifier.

If it were not for thermal effects, variation of respective base-emitter voltages of each of the two transistors, Q2, Q3, would be substantially identical. However, the power dissipated in the second transistor, Q3, is greater than the power dissipated in the first transistor, Q2. Accordingly, the thermally generated component of the base-emitter voltage of transistor Q3, is greater than the thermally generated component of the base-emitter voltage of transistor, Q2.

A filtered compensation signal is derived by taking a difference between the respective base-emitter voltages of each of the two transistors, amplifying the difference using a adjustable gain amplifier, A2, and then filtering the amplified difference using a low pass filter, LPF. The filtered compensation so derived is substantially free of any base width modulation component, however the embodiment shown in FIG. 3 is more complex that the embodiment shown in FIG. 2 and discussed in detail previously herein. The filtered compensation signal is injected into a suitable node of the wide band amplifier so as to substantially compensate the output signal of the wide band amplifier for the undesirable signal dependent thermal offset voltages.

The present invention provides a method and apparatus for maintaining stability while substantially compensating an output signal of a high gain, wide band electronic amplifier having an undesirable signal dependent thermally generated offset voltage. Although specific embodiments of the invention have been described and illustrated, the invention is not to be limited to the specific technology, forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. A method for substantially compensating an output signal of a wide band electronic amplifier having an undesirable signal dependent thermally generated offset voltage, comprising:

providing a thermal offset voltage generator having a signal dependent thermally generated offset voltage similar to that of the wide band amplifier;

coupling an input of the thermal offset voltage generator with an output of the wide band amplifier so as to generate a compensating signal; and injecting the compensating signal into the wide band amplifier so as to substantially compensate an output signal of the wide band amplifier for the undesirable signal dependent thermally generated offset voltage.

2. A method as in claim 1 further comprising low pass filtering the compensating signal.

3. An apparatus comprising:

a wide band amplifier having an undesirable signal dependent thermally generated offset voltage;

a thermal offset voltage generator having a signal dependent thermally generated offset voltage similar to that of the wide band amplifier, an input of the thermal offset voltage generator being coupled with an output of the wide band amplifier, the thermal offset voltage generator having an output for providing a compensating signal; and means for injecting the compensating signal into the wide band amplifier so as to substantially compensate the output signal of the wide band amplifier for the undesirable signal dependent thermally generated offset voltage.

4. An apparatus as in claim 3 further comprising a low pass filter coupled with the wide band amplifier and the thermal offset voltage generator for filtering the compensating signal.

5. An apparatus as in claim 3 further comprising an adjustable gain amplifier coupled with thermal offset voltage generator.

6. An apparatus comprising:

a wide band amplifier including at least one transistor having an undesirable signal dependent thermally generated offset voltage;

a thermal offset voltage generator including at least one transistor having a signal dependent thermally generated offset voltage similar to that of the transistor of the wide band amplifier, an input of the thermal offset voltage generator being coupled with an output of the wide band amplifier, the thermal offset voltage generator having an output for providing a compensating signal; and means for injecting the compensating signal into the wide band amplifier so as to substantially compensate the output signal of the wide band amplifier for the undesirable signal dependent thermally generated offset voltage.

7. An apparatus as in claim 6 further comprising a low pass filter coupled with the wide band amplifier and the thermal offset voltage generator for filtering the compensating signal.

8. An apparatus as in claim 6 further comprising an adjustable gain amplifier coupled with the thermal offset voltage generator.

* * * * *